United States Patent
Tu

(10) Patent No.: US 6,359,276 B1
(45) Date of Patent: Mar. 19, 2002

(54) MICROBOLOM INFRARED SENSORS

(76) Inventor: Xiang Zheng Tu, 440 Davis Ct., #314, San Francisco, CA (US) 94111

( * ) Notice: Subject to any disclaimer, the term of this patent is extended or adjusted under 35 U.S.C. 154(b) by 0 days.

(21) Appl. No.: 09/348,093

(22) Filed: Jul. 6, 1999

(30) Foreign Application Priority Data

Oct. 21, 1998 (CN) .......................................... 98120652

(51) Int. Cl.⁷ ............................................ H01L 31/058
(52) U.S. Cl. ..................................... 250/338.1; 250/332
(58) Field of Search ........................... 250/338.1, 338.4, 250/332, 349, 495.1

(56) References Cited

U.S. PATENT DOCUMENTS

| 5,596,219 A | * | 1/1997 | Hierold .................... 257/467 |
| 5,789,753 A | * | 8/1998 | Gooch et al. ............... 250/349 |
| 5,830,372 A | * | 11/1998 | Hierold ..................... 216/2 |
| 6,194,722 B1 | * | 2/2001 | Fiorini et al. ............ 250/338.1 |

FOREIGN PATENT DOCUMENTS

DE 19752208 A1 * 11/1997 ........... G01F/1/692

* cited by examiner

Primary Examiner—Constantine Hannaher
Assistant Examiner—Otilia Gabor
(74) Attorney, Agent, or Firm—Bruce H. Johnsonbaugh

(57) ABSTRACT

A microbolometer infrared sensor utilizes a porous silicon bridge as its thermal isolating and mechanical supporting structure. Porous silicon formed from single crystal silicon on lightly doped p-type silicon has a thermal conductivity lower than silicon dioxide and silicon nitride, and, therefore, when used as a mechanical supporting structure, can offer better thermal isolation performance. The porous silicon layer can be fabricated much thicker than silicon dioxide and silicon nitride membranes since there is almost no residual stress therein. A thicker porous silicon bridge has higher mechanical support strength. The porous silicon process is a low temperature process. It facilitates a fabrication strategy of microelectronics first and micromechanics last.

17 Claims, 5 Drawing Sheets

MICROBOLOM INFRARED SENSORS

CROSS REFERENCE TO RELATED APPLICATION

This application claims the benefit of China patent application Serial No. 98120652.2, filed on Oct. 21, 1998, and entitled "Microbolom Infared Sensors," and naming Xiang Zheng Tu as inventor.

BACKGROUND OF THE INVENTION

1. Field of the Invention

The invention relates to a microbolometer infrared sensor. Particularly, the invention relates to a microbolometer infrared sensor utilizing a porous silicon bridge as its thermal isolating and mechanical supporting structure.

2. Description of the Related Art

Microbolometer infrared sensors have a wide variety of applications, ranging from security night sights and driving aids to area surveillance, fire-fighting, industrial radiometry, search and rescue, border patrol and vehicle collision avoidance.

Newly developed microbolometer infrared sensors are fabricated based on integrated circuit fabricating techniques and micromachining techniques. This type of microbolometer infrared sensors can operate at room temperature without the need for cryocooling, which improves sensor reliability, reduces sensor power and cost and therefore gains a variety of civilian or consumer applications.

Generally, a microbolometer infrared sensor comprises a temperature-dependent resistor and an infrared absorber. To achieve a high responsively of the microbolometer infrared sensor, there are two methods to be commonly adopted. One is to choose large resistance temperature coefficient of the resistor material, so that a small increase in temperature gives rise to a significant change in the resistance of the temperature-dependent resistor. The other is to reduce the thermal exchange between the temperature-dependent resistor and its surroundings, so that most of the thermal energy absorbed by the infrared absorber contribute to raise the temperature of the resistor. This can be accomplished by minimizing the thermal contact by suspending the resistor in air or vacuum.

As is known in the art, micromachining technologies are being used to form various microstructures. One such microstructure is a microbrigde anchored to a silicon substrate through thin supports which can be used to built a microbolometer infrared sensor. The geometry and the thermal conductivity of the microstructure determine the thermal insulation. Typical microstructure materials are silicon oxide or silicon nitride.

Moreover, an array of such microbolometer infrared sensors is formed integrally with an integrated circuit. The integrated circuit is used to develop signals produced by the microbolometer infrared sensors in response to the infrared energy impinging on to the array thereof.

One type of microbolometer infrared sensors utilizes thermalgrown silicon dioxide as a microstructure material. Residual stress in a thermal-grown silicon dioxide film is up to 200 MPa. This limits the thickness of a silicon dioxide film to be less than 2 $\mu$. Actually, the thickness of silicon dioxide films used in standard integrated circuits is about 1 $\mu$. Microstructures of such thin silicon dioxide films have very poor mechanical properties.

Another type of microbolometer infrared sensors utilizes silicon nitride as a microstructure material. Although silicon-rich silicon nitride films formed by low-pressure chemical vapor deposition (LPCVD) have lower stress, but its thickness is still limited to about 2 $\mu$. In addition to mechanical strength problem, microstructures of silicon nitride also have following other problems.

1. Patterning a silicon nitride film formed on the surface of a silicon substrate creates steps on the surface of the substrate. Thicker the silicon nitride films higher the steps. This is not compatible with standard semiconductor technologies.

2. The thermal conductivity of silicon nitride is not quite low. It is not suitable for the use as a thermal insulating material.

Common problems with microbolometer infrared sensors based on silicon oxide or silicon nitride are not only to have poor mechanical strength, but also to have difficulties with processing. "Microelectronics first and micromachining last" is an important strategy for fabricating microelectrical-mechanical system (MEMS) devices. As one of MEMS devices, it is a hope to fabricate microbolometer infrared sensors after processing the integrated circuitry necessary for the driving and read-out electronics. But forming the silicon oxide films or the silicon nitride films are not low temperature processes. It can not be performed after processing the integrated circuits.

SUMMARY OF THE INVENTION

In view of the above problems, the present invention provides a microbolometer infrared sensor having the following features.

One feature of the microbolometer infrared sensor provided by the present invention is to form a microbridge and its supports in a silicon substrate so that there is no steps created on the surface of the substrate, and therefor no influence on the planar processing.

Another feature of the microbolometer infrared sensor provided by the present invention is that the microbridge and its supports have higher mechanical strength and lower residual stress.

Still another feature of the microbolometer infrared sensor provided by the present invention is that the microbridge and its supports have lower thermal conductance or higher thermal resistance.

Still another feature of the microbolometer infrared sensor provided by the present invention is to form the microbridge and its supports at lower temperature so that it can be done after processing the integrated circuit.

Still another feature of the microbolometer infrared sensor provided by the present invention is that the microbridge and its supports are separated from the substrate by a narrower gap so that they are forced to touch the substrate without damage.

These and other features and advantages of the invention will be apparent to those skilled in the art from the following detailed description of preferred embodiments, taken together with the accompanying drawings.

DETAILED DESCRIPTION OF CERTAIN PREFERRED EMBODIMENTS

Figure 1:
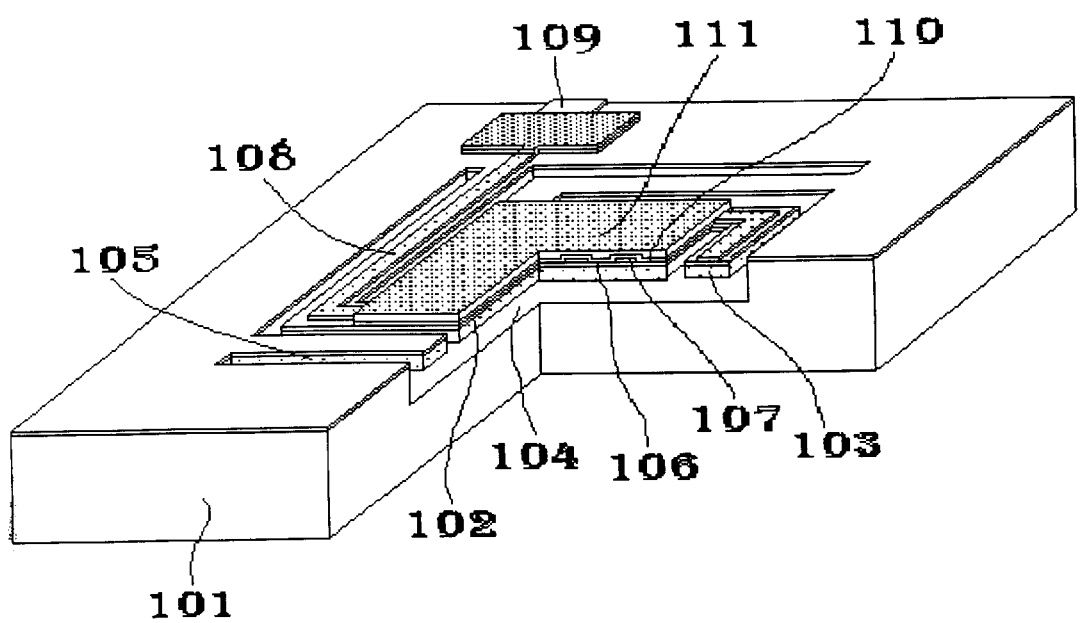
FIG. 1 illustrates the perspective, partially cross-sectional, diagrammatic sketch of a microbolometer infrared sensor in accordance with the present invention.

In according to the present invention, a microbolometer infrared sensor array is disposed in a silicon substrate in which there already exists a CMOS circuit with readout electronics. Each microbolometer infrared sensor includes a porous silicon membrane bridging a cavity recessed into the substrate. The porous silicon membrane has four porous silicon beams. The distal ends of the porous silicon beams are anchored to the substrate, so that the porous silicon membrane is supported by the substrate and the surface of the porous silicon beams is aligned with the plane surface of the substrate. The surface of the porous silicon membrane and beams is coated with silicon dioxide film. A temperature sensitive resistor is disposed on the surface of the silicon dioxide film. The end portions of the resistor are disposed on the porous silicon beams and keep in contact with the proximal end portions of electrical conductors which already exist on the surface of the substrate. The surface of the resistor is coated with another silicon dioxide film. An infrared absorber used as a top layer covers over the porous silicon membrane. The cavity is a narrow gap, so that the porous silicon membrane can touch the bottom of the cavity without damage as it is forced to bend downward. The trenches between the porous silicon membrane and the beams and between the beams and the edges of the substrate are also narrow, so that the porous silicon membrane and beams can touch the edge of the substrate, as they are forced to bend in the lateral directions.

Porous silicon is single crystal silicon which contains a very high density of micropores or channels. Porous silicon is formed during anodization of silicon in hydrofluoric acid (HF). A value of anodic voltage required to initiate anodization varies with the doping type and doping concentrations of the silicon and can be arranged in the order: heavily doped N-type silicon<heavily doped P-type silicon <lightly doped P-type silicon<lightly doped N-type silicon. According to the order, porous silicon can be selectively formed in the heavily doped N-type and heavily doped P-type regions in a lightly doped P-type silicon substrate by means of controlling anodic voltage. Porous silicon also can be formed in the heavily doped P-type, heavily doped N-type, and lightly doped P-type regions in a lightly doped N-type silicon substrate by means of controlling anodic voltage.

It has been shown that the thermal conductivity of the porous silicon formed on lightly doped P-type silicon wafers is about three to five orders of magnitude smaller than that of bulk silicon. In general, It can be expected that the thermal conductivity of the porous silicon decrease dramatically with increasing the porosity, since the thermal conductivity of a porous medium consisting of a solid phase is proportional to the cubic volume fraction of the solid phase. More particularly, the mean size of the silicon crystallites in the porous silicon formed on lightly doped P-type silicon is about 30 Å, which is significantly smaller than the mean free path of phonons in silicon. This also dramatically reduces the thermal conductivity of the porous silicon formed on lightly doped P-type silicon.

For the porous silicon formed on a P-type silicon wafer with a resistivity of $0.2\Omega$-cm and having a porosity of 64%, the thermal conductivity at 300K is 0.2W/(MK). It is noted that the thermal conductivity of silicon dioxide at 300K is 1.4W/(MK) and the thermal conductivity of silicon nitride at 300K is 5–18W/(MK).

Porous silicon is very reactive, due to its enormous, exposed surface area. It is easy to etch in a diluted base solution. It has been reported to produce thick silicon dioxide films at temperature lower than 800° C. and to produce thick silicon nitride films at 725° C. Low temperature treatment in various gas atmospheres has been used to stabilize the structure of porous silicon for applications in humid and corrosive environment and at high temperatures.

The residual stress in porous silicon only consists of intrinsic stress and is compressive stress with 50 MPa to 80 MPa in as-grown porous silicon. By heat-treatment at 250° C. in dried nitrogen atmosphere for 10 min, the initial compressive stress decreases to compressive stress with 3 MPa. It is noted that the residual tensile stress in thermal-grown silicon dioxide is 350 MPa and the residual tensile stress in silicon-rich silicon nitride is 100 MPa.

It has been shown that the total stress in a porous silicon layer has a tendency to be saturated when the thickness of the porous silicon layer reaches $15\,\mu$. Because of this, porous silicon layers as thick as $300\,\mu$ of homogeneous morphology can be formed.

The morphology of porous silicon is affected by the addition to the HF solution. Using a surfactant as an addition, a smooth surface with an evenly controlled pore-size distribution with pore diameters averaging around 10 Å to 50 Å can be obtained.

Now, referring to FIG. 1, a microbolometer infrared sensor in accordance with the present invention is shown. The sensor comprises a silicon substrate 101, a porous silicon membrane 102, four porous silicon beams 103, four trenches 105, a cavity 104, an insulating film 106, a thermal sensitive resistor 107, an electrical conductor 108, a bonding pad 109, another insulating film 110, and an infrared absorber 111.

The cavity 104 recesses into substrate 101. The porous silicon membrane 102 bridges over cavity 104. The four porous silicon beams 103 support porous silicon membrane 102 at their proximal ends and anchored to the edge of substrate 101 at their distal ends. The four trenches 105 separates porous silicon beams 103 from porous silicon membrane 102 and the edge of substrate 101. The insulating film 106 coats porous silicon membrane 102 and porous silicon beams 103. The thermal sensitive resistor 107 has its end portions on the proximal ends of the porous silicon beams 103 and is in contact with the proximal end of the electrical conductor 108. The electrical conductor 108 extends to bonding pad 109. The insulating film 110 coats the resistor 107. The infrared absorber 111 as a top layer covers the porous silicon membrane 102.

Referring in more detail to FIG. 2 through FIG. 12, the method of fabricating the microbolometer infrared sensor in accordance with the present invention will be described.

The microbolometer infrared sensor is preferably fabricated on a silicon (Si) substrate 201 with an industry standard CMOS circuit formed thereof. The substrate 201 is a 2–$4\Omega$-cm, n-type (100) Si wafer. The n-channel CMOS circuit includes a p-well 202, a source/drain 204, a field oxide region 206, a gate 205, a metal interconnection 208, and a passivation film 210 have been formed in substrate 201. There is a region used for forming the sensor. The region includes a p-well 203 and an electrical conductor 209. The P-well 203 has a square resistance 2–3 k$\Omega$ and a junction depth of 6–8 $\mu$. The electrical conductor 209 is disposed the outside of the p-well 203 and its distal end extends to the CMOS circuit.

Figure 2:
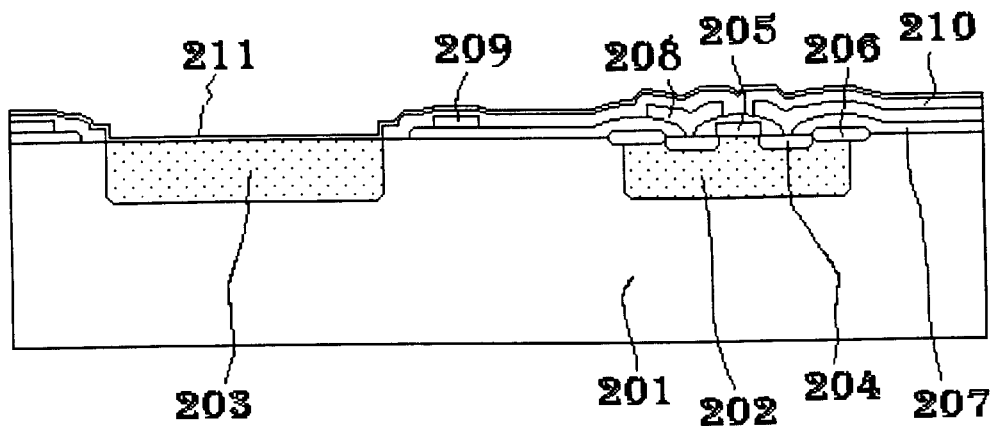
FIG. 2 to FIG. 12 illustrates the cross-sectional views of the microbolometer infrared sensor of FIG. 1 at various stages in the fabrication thereof. The microbolometer infrared sensor is preferably fabricated on industry-standard silicon wafers using standard silicon processing techniques (photolithography, etching etc.). The readout circuitry is fabricated into the silicon wafer. The circuitry includes n- and p-channel transistors, bus lines and interconnecting metallizations. The circuitry may be of conventional design.

As the first fabrication step of the sensor, the passivation film 210 is patterned with a photolithography process to expose a portion of the p-well 203 region. The passivation film 210 is made of phosphorus-doped low temperature oxide (LTO) and is etched with a solution of buffered hydrofluoric acid (BHF). Then a 4000 Å thick amorphous silicon carbide (a-sic) film 211 is deposited over the surface of substrate 201 by plasma enhanced chemical vapor deposition (PECVD). The deposition is performed under the conditions: temperature 400° C., pressure 2.25 torr, $SiH_4$ flow 100 sccm; $CH_4$ flow 3000 sccm, power 1000W. After the deposition, annealing is performed at 400° C. in nitrogen atmosphere for 30 min. The resulted structure is shown in FIG. 2.

The residual stress in the a-SiC film is about 20 MPa. Immersing the a-SiC film in 33 wt % KOH solution at 85° C. for 4 h or 40% HF solution for 40 min, no etch rates can be measured.

The second fabrication step is to conduct a first anodization of the Si substrate 201 in HF solution. Before the anodization, A pattern is formed in the a-SiC film 211 by a photolithography process to create a square opening in the p-well 203 region. The a-SiC film is etched by dry etching in a reactive ion etcher (RIE). The etching gas used is a mixer of $CF_4$, $SF_6$ and $O_2$.

Figure 3:
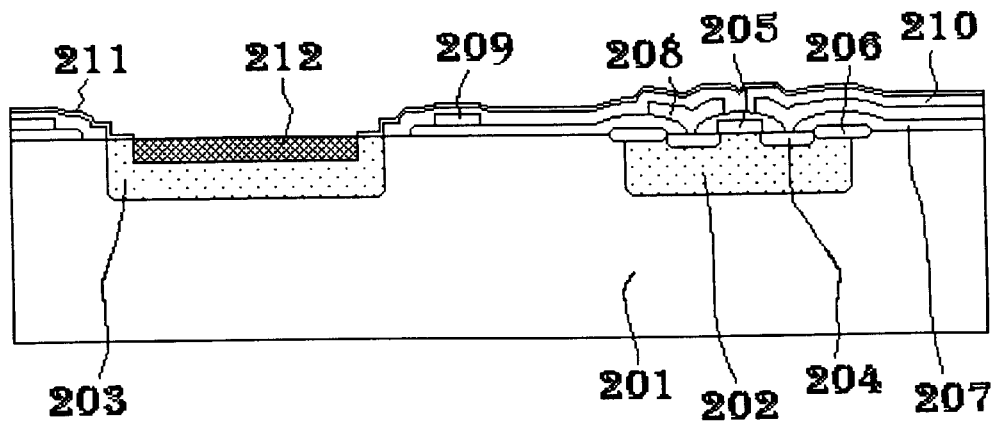

An anodization cell to be used is made of Teflon and divided into two compartments by a Si substrate to be anodized. Each compartment has a platinum electrode with its distal end connecting to a power supply. A HF solution to be used is a mixer of 1 part 48 wt % HF and 1 part Triton X-100 (Octyphenol-polyethylene glycol ether). Triton X-100 is helpful for reducing the surface tension of the solution and enhancing the wettability of the solution. The anodic current is kept at about 80 mA/cm$^2$ during the anodization. It is required to form porous silicon having a porosity of about 70%. The anodization is restricted in the p-well 203 region and only to convert the upper layer of the p-well 203 region into porous silicon layer 212 having a thickness of 4–6 $\mu$, as shown in FIG. 3.

Next, the porous silicon layer 212 is subjected to a thermal treatment for stabilizing its porous structure. The thermal treatment is performed at 400° C. in dry oxygen atmosphere for 15 min. As a result, one or two atom layer-thick silicon dioxide ($SiO_2$) film is formed on the surface of the inner pores of the porous silicon. This $SiO_2$ film is used to prevent the porous silicon from etching in a diluted KOH solution in a short time.

As an alternative, the porous silicon layer 212 is heated at 400° C. in nitride diluted ammonia atmosphere for 15 min. This thermal treatment results in forming a very thin silicon nitride ($Si_3N_4$) film on the surface of the inner pores of the porous silicon. This $Si_3N_4$, film has an etch-resistibility better than the above-mentioned $SiO_2$ film.

Figure 4:
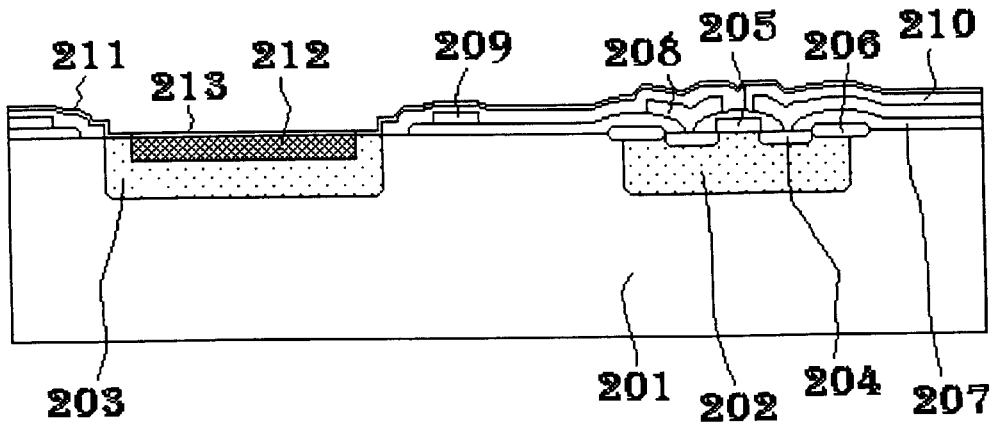

The third fabrication step is to form a $SiO_2$ film 213 over the surface of the porous silicon layer 212, as shown in FIG. 4. The deposition of the $SiO_2$ film is carried out by a PECVD process under the conditions: temperature 400° C., source gases $SiH_4$ and $N_2O$, carrying gas $N_2$, pressure 100 Pa, resulting in a thickness of 1000 Å. The $SiO_2$ film 213 is not only used as an insulating film, but also for sealing the pores of the porous silicon layer to protect the porous silicon layer 212.

The fourth fabrication step is to form a thermal sensitive resistor 214. To do this, a pattern is formed in the $SiO_2$ film 213 by a photolithography process to create openings in the electrical conductor 209. The $SiO_2$ in the opening is etched with the same solution as used above. Then a resistive film is formed over the surface of the porous silicon layer 211 including the openings in the electrical conductor 209.

Titanium (Ti) is preferably chosen to be the material of the resistor 214. It is noted that the thermal conductivity of Ti is 0.0022W/(MK), the electrical resistance is $4.2 \times 10_{-5}\Omega$-cm and the thermal coefficient of the resistance is $2.5 \times 10^{-3}$. Ti is widely used as an adhesive layer in metallization in integrated circuit fabrications. A 100 Å-thick Ti film is deposited over the surface of the substrate 201 by sputtering. The square resistance of the Ti film is expected to be 42$\Omega$.

Figure 5:
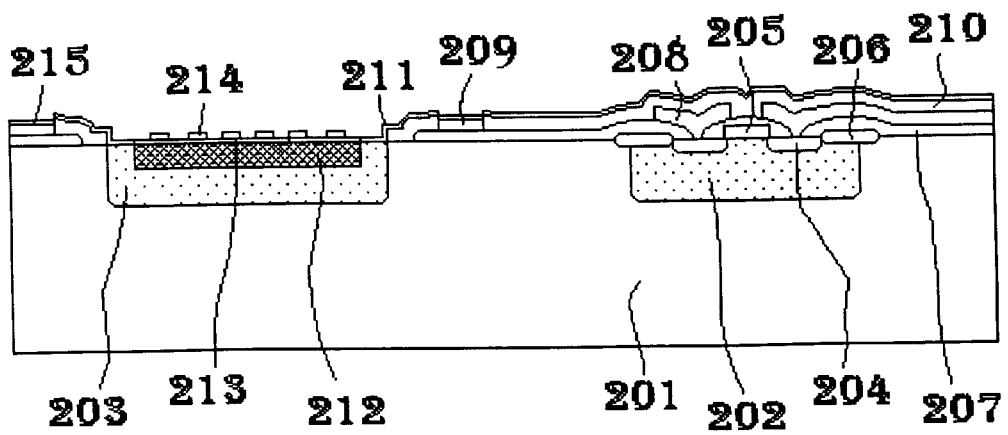

Then, a pattern is formed in the Ti film by a photolithography process to form the resistor 214. The resistor 214 has two end portions 215 disposed over the openings of the electrical conductor 209. The Ti is etched with a solution of HF, hyperoxide ($H_2O_2$) and water. The resulted structure is shown in FIG. 5.

Figure 6:
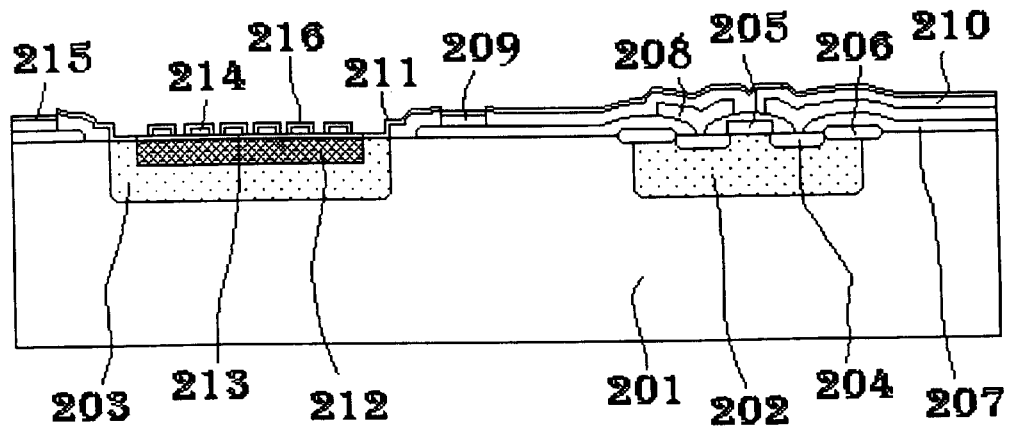

The fifth fabrication step is to form an insulating film for coating the resistor 214. Another 1000 Å-thick $SiO_2$ film 216 is deposited over the surface of the Si substrate 201 by PECVD. Then a pattern is formed in $SiO_2$ film 216 by a photolithography process. The resulted structure is shown in FIG. 6.

The sixth fabrication step is to form an infrared absorber 217. Porous gold or black gold is used as a material of the absorber 216. Gold is evaporated thermally in a nitrogen atmosphere of 100 Pa. Due to the collisions of the evaporated gold atoms with the nitrogen molecules, the gold atoms lose their kinetic energy and are slowed down to thermal speed. When they hit the surface, their energy is too low to allow surface mobility and the atoms stick at their point of impact with the surface resulting in a porous gold film.

Figure 7:
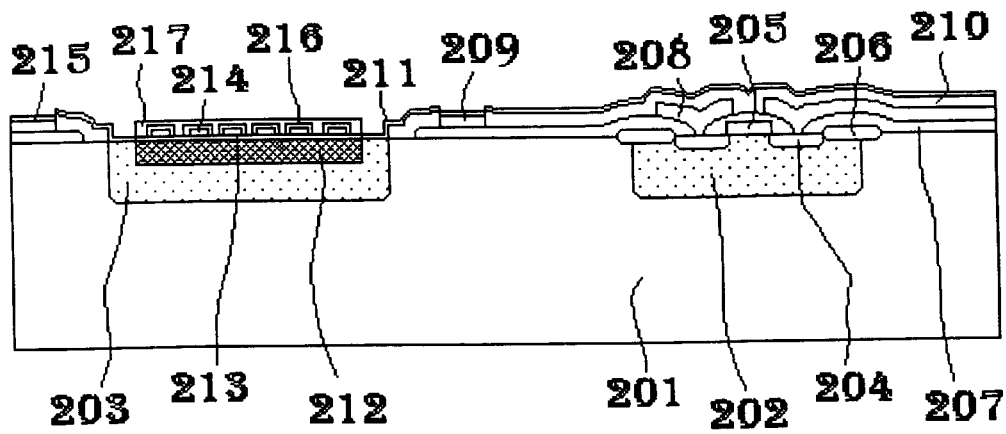

A pattern is formed in the porous gold or black gold layer by a lift-off process. A pattern of positive photoresist is used as a mask. The porous gold is deposited over the photoresist pattern. It is noted that the Si substrate is not heated beyond 150° C. during the deposition process. This is to ensure that the photoresist is not harmed. After the metallization, the Si substrate is subjected to immerse in acetone to remove the gold over the area protected by the photoresist film, leaving the pattern 217. The resulted structure is shown in FIG. 7.

Figure 8:
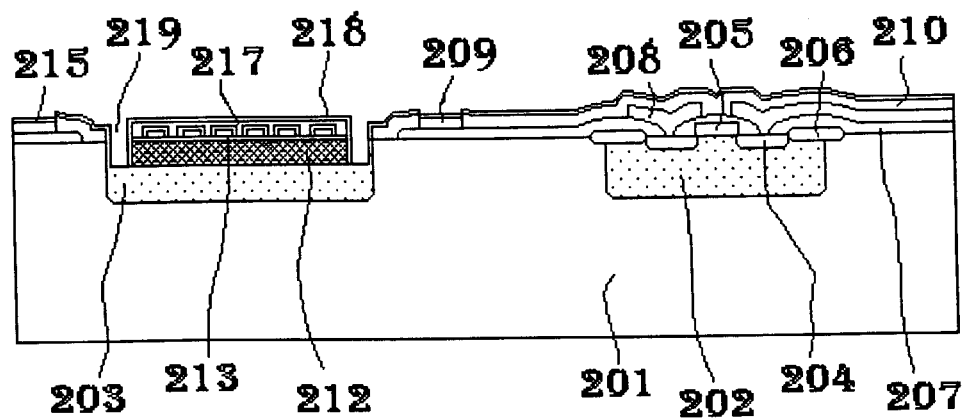

The seventh fabrication step is to form another 4000 Å-thick a-SiC film 218 for the use in a second anodization. The thick a-SiC film is deposited over the surface of substrate 201 by PECVD under the conditions as the same as mentioned above. A pattern is formed in the thick a-SiC film by a photolithography process to create anodization trenches 219 along the edge of the porous silicon layer 212. The a-SiC in the trench regions is etched by RIE under the conditions as the same as above mentioned, using a patterned photoresist film as an etch mask. The $SiO_2$. in the trench regions is etched with a solution as the same as above mentioned. The Si in the trench regions is etched by RIE under the conditions: temperature 40° C., RF power 2000w, RF frequency 13.56 MHz, pressure 250 torr, $Cl_2$ flow 70 sccm, and $He_2$ flow 70 sccm. The formed trenches have a depth of 4–6 $\mu$. It is noted that the formed trenches should be restricted inside of the p-well 203 region. The resulted structure is shown in FIG. 8.

Figure 9:
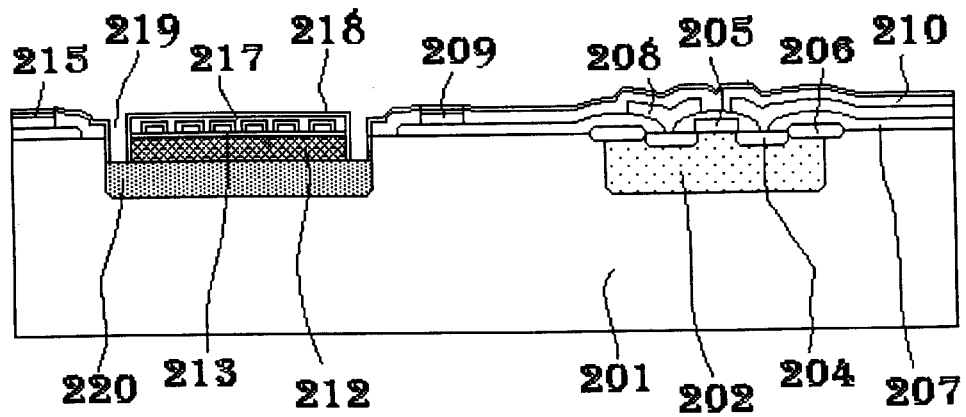

The eighth fabrication step is to perform a second anodization of the Si substrate 201 in a HF solution. The anodization conditions to be used are the same as used above. Under no light illumination, the anodization reaction is restricted to the inside of the p-well 203 region. As soon as the lower layer of the p-well 203 region converts into a porous silicon layer 220, the anodization reaction stops automatically. No n-type silicon of the substrate 201 is attacked during the anodization process. The resulted structure is shown in FIG. 9.

Figure 10:
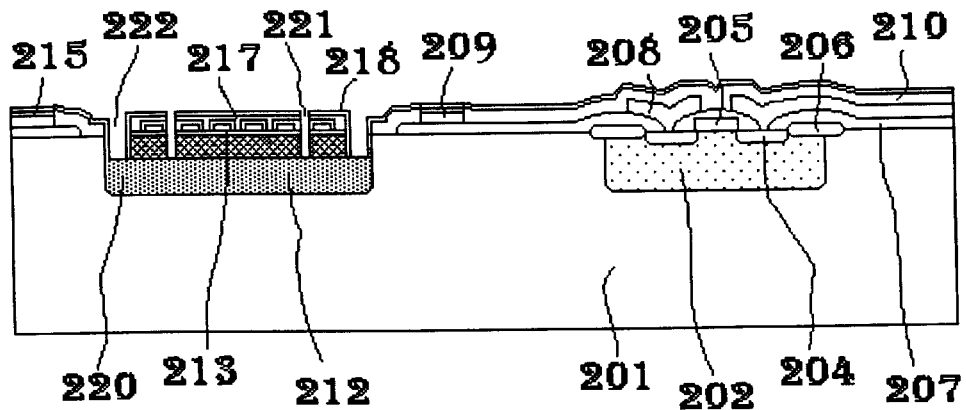

The ninth fabrication step is to form more trenches 221, 222 in the porous silicon layer 212. Using a patterned photoresist film with openings as a mask, the a-SiC, the SiO. and the upper porous silicon in the openings are etched by a corresponding technique above mentioned, respectively. The resulted structure is shown in FIG. 10.

Figure 11:
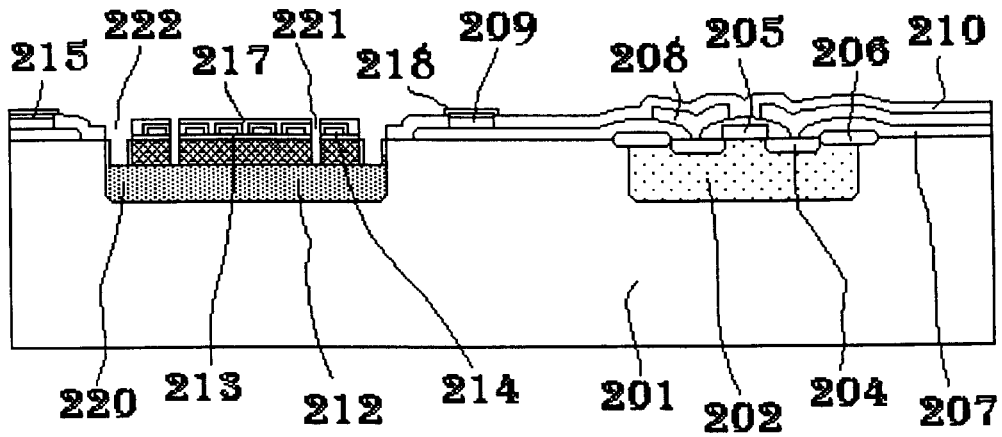

As a tenth fabrication step, a photoresist pattern is formed to expose all surfaces of the Si substrate 201, except a portion over the electrical conductor 215. Using the formed photoresist pattern as a mask, the a-SiC film 218 is etched by RIE using the same recipe as described above. The resulted structure is shown in FIG. 11.

Figure 12:
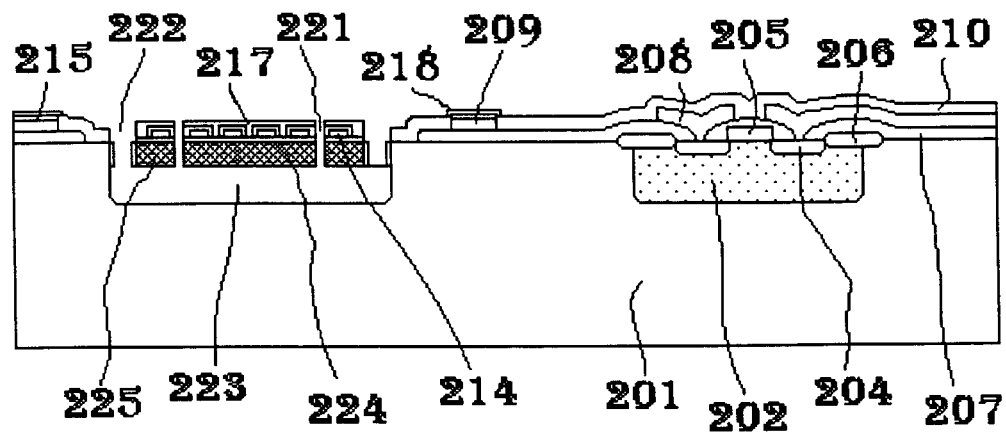

The eleventh fabrication step is to remove the porous silicon layer 209 in the p-well 203 region. The etchant to be used is a KOH solution of 1–3 w %. The etchant can not attack the porous silicon layer 211 immediately since the surface of the inner pores of the porous silicon 211 is coated with a thin $SiO_2$ or $Si_3N_4$ film. The etchant can also not attack the silicon of the Si substrate 201 since the KOH solution is diluted and the etching is performed at room temperature. After the etching, a cavity 223, a porous silicon membrane 224, and four porous silicon beams 225 are formed, as shown in FIG. 12.

Other embodiments are within the spirit and scope of the appended claims. Numerous variations and alternate embodiments will occur to those skilled in the art without departing from the spirit and scope of the invention.

What is claimed is:

1. A method for forming a microbolometer infrared sensor comprising:

providing a silicon substrate having a CMOS circuit, an additional p-well and two electrical conductors extending from said CMOS circuit to the edge of said p-well region;

removing the passivation film over the surface of said p-well region;

forming a first anodization mask to expose a central portion of the surface of said p-well region;

performing a first anodization of said substrate in HF solution to convert the upper layer of said p-well region into a first porous silicon layer;

forming a thin film protecting the surface of the inner pores of said first porous silicon layer from etching by a diluted base solution;

forming a first insulating film coating the surface of said first porous silicon layer;

forming a thermal sensitive resistor disposed on the surface of said first insulating film and having end portions being in contact with said electrical conductor;

forming a second insulating film coating said thermal sensitive resistor;

forming an infrared absorber covering the top of said first porous silicon layer;

forming a second anodization mask having trenches disposed along the edge of said p-well region and depressing into said p-well region;

performing a second anodization of said substrate in HF solution to convert the lower layer of said p-well region into a second porous silicon layer;

forming more trenches passing through said first porous silicon layer;

removing the second porous silicon layer; and removing the remaining anodization mask film.

2. The method recited in claim 1 wherein said p-well having an average resistivity ranging from 0.1 Ω-cm to 20 Ω-cm.

3. The method recited in claim 1 wherein said thin film is a silicon dioxide film formed at 300–500° C.

4. The method recited in claim 1 wherein said thin film is a silicon nitride film formed at 300–500° C.

5. The method recited in claim 1 wherein said anodization mask is made of amorphous silicon carbide deposited by plasma enhanced vapor chemical deposition (PECVD).

6. A method for forming a microbolometer infrared sensor comprising:

providing a silicon substrate having a CMOS circuit, an additional p-well having a $p^+$ layer thereon and two electrical conductors extending from said CMOS circuit to the edge of said $p^+$ layer;

removing the passivation film over the surface of said $p^+$ layer;

forming a first anodization mask to the surface of said $p^+$layer;

performing a first anodization of said substrate in HF solution to convert said $p^+$layer into a first porous silicon layer;

forming a thin film protecting the surface of the inner pores of said first porous silicon layer from etching by a diluted base solution;

forming a first insulating film coating the surface of said first porous silicon layer;

forming a thermal sensitive resistor disposed on the surface of said first insulating film and having end portions being in contact with said electrical conductor;

forming a second insulating film coating said thermal sensitive resistor;

forming an infrared absorber covering the top of said first porous silicon layer;

forming a second anodization mask having trenches disposed along the edge of said p-well region and depressing into said p-well region;

performing a second anodization of said substrate in HF solution to convert said p-well region into a second porous silicon layer;

forming more trenches passing through said first porous silicon layer;

removing the second porous silicon layer; and removing the remaining anodization mask film.

7. The method recited in claim 6 wherein said p-well having an average resistivity ranging from 0.1 Ω-cm to 20 Ω-cm.

8. The method recited in claim 6 wherein said $p^+$layer having a sheet resistance of 10 Ω/square to 40 Ω/square.

9. The method recited in claim 6 wherein said thin film is a silicon dioxide film formed at 300–500° C.

10. The method recited in claim 6 wherein said thin film is a silicon nitride film formed at 300–500° C.

11. The method recited in claim 6 wherein said anodization mask is made of amorphous silicon carbide deposited by plasma enhanced vapor chemical deposition (PECVD).

12. A method for forming a microbolometer infrared sensor comprising:

provinding a silicon substrate having a CMOS circuit, an additional p-well having a $n^+$ layer thereon and two electrical conductors extending from said CMOS circuit to the edge of said $n^+$layer;

removing the passivation film over the surface of said $n^+$layer;

forming a first anodization mask to the surface of said $n^+$layer;

performing a first anodization of said substrate in HF solution to convert said $n^+$ layer into a first porous silicon layer;

forming a thin film protecting the surface of the inner pores of said first porous silicon layer from etching by a diluted base solution;

forming a first insulating film coating the surface of said first porous silicon layer;

forming a thermal sensitive resistor disposed on the surface of said first insulating film and having end portions being in contact with said electrical conductor;

forming a second insulating film coating said thermal sensitive resistor;

forming an infrared absorber covering the top of said first porous silicon layer;

forming a second anodization mask having trenches disposed along the edge of said p-well region and depressing into said p-well region;

performing a second anodization of said substrate in HF solution to convert said p-well region into a second porous silicon layer;

forming more trenches passing through said first porous silicon layer;

removing the second porous silicon layer; and removing the remaining anodization mask film.

13. The method recited in claim 12 wherein said p-well having an average resistivity ranging from 0.1 $\Omega$-cm to 20 $\Omega$-cm.

14. The method recited in claim 12 wherein said $n^+$ layer having a sheet resistance of 10 $\Omega$/square to 40 $\Omega$/square.

15. The method recited in claim 12 wherein said thin film is a silicon dioxide film formed at 300–500° C.

16. The method recited in claim 12 wherein said thin film is a silicon nitride film formed at 300–500° C.

17. The method recited in claim 12 wherein said anodization mask is made of amorphous silicon carbide deposited by plasma enhanced vapor chemical deposition (PECVD).

* * * * *

UNITED STATES PATENT AND TRADEMARK OFFICE
CERTIFICATE OF CORRECTION

PATENT NO. : 6,359,276 B1  Page 1 of 1
DATED : March 19, 2002
INVENTOR(S) : Xiang Zheng Tu It is certified that error appears in the above-identified patent and that said Letters Patent is hereby corrected as shown below:

Title page,
Item [54], change the title from "MICROBOLOM INFRARED SENSORS" to
-- MICROBOLOMETER INFRARED SENSORS --

Signed and Sealed this

Fourth Day of June, 2002

*Attest:*

JAMES E. ROGAN
*Attesting Officer*  *Director of the United States Patent and Trademark Office*